(12) United States Patent
Sakai et al.

(10) Patent No.: US 8,254,597 B2
(45) Date of Patent: Aug. 28, 2012

(54) AUDIO SIGNAL PROCESSING CIRCUIT

(75) Inventors: Mitsuteru Sakai, Kyoto (JP); Yosuke Sato, Kyoto (JP)

(73) Assignee: Rohm Co., Ltd. (JP)

( * ) Notice: Subject to any disclaimer, the term of this patent is extended or adjusted under 35 U.S.C. 154(b) by 733 days.

(21) Appl. No.: 12/389,736

(22) Filed: Feb. 20, 2009

(65) Prior Publication Data

US 2009/0208034 A1 Aug. 20, 2009

(30) Foreign Application Priority Data

Feb. 20, 2008 (JP) ................................. 2008-039147

(51) Int. Cl.
*H03G 3/00* (2006.01)
(52) U.S. Cl. ......................... 381/107; 375/345; 330/129
(58) Field of Classification Search .................. 381/107; 375/345; 330/129
See application file for complete search history.

(56) References Cited

U.S. PATENT DOCUMENTS

| 5,130,665 | A  | * | 7/1992 | Walden ........................ 330/129 |
| 7,218,679 | B2 | * | 5/2007 | Kodama et al. ............... 375/259 |
| 2001/0020867 | A1 | * | 9/2001 | Miura ........................... 330/129 |
| 2002/0011119 | A1 | * | 1/2002 | Bignell et al. .............. 73/861.23 |
| 2004/0190653 | A1 | * | 9/2004 | Yasui et al. .................... 375/345 |
| 2006/0072696 | A1 | * | 4/2006 | Kobayashi et al. ........... 375/374 |

FOREIGN PATENT DOCUMENTS

| JP | 9-102843 | | 4/1997 |
| JP | 2002-26670 | A | 1/2002 |
| JP | 2005-286532 | A | 10/2005 |
| JP | 2008-35113 | A | 2/2008 |

OTHER PUBLICATIONS

Notification for Reason(s) for Refusal for Japanese Patent Application No. 2008-039147, dispatched Jan. 24, 2012, with English translation.

* cited by examiner

*Primary Examiner* — Phuc Dang
(74) *Attorney, Agent, or Firm* — Cantor Colburn LLP

(57) ABSTRACT

Plural variable gain amplifiers amplify audio signals of plural channels for each channel. An interface receives, from outside, plural gain control data individually designating gain of each channel. Plural gain controllers respectively switch the gain of the plural variable gain amplifiers, based on the plural gain control data. The plural gain controllers arrange timing to change gain of a variable gain amplifier corresponding to gain control data received in a predetermined data entry period, among the plural gain control data that are inputted at different timing.

17 Claims, 5 Drawing Sheets

| S | SLAVE ADDRESS | A | SELECT ADDRESS | A | CONTROL DATA | A | P |

AUDIO SIGNAL PROCESSING CIRCUIT

CROSS REFERENCE TO RELATED APPLICATIONS

The present application claims priority under 35 U.S.C. §119 to Japanese Application No. 2008-039147 filed Feb. 20, 2008, the entire content of which is incorporated herein by reference.

BACKGROUND OF THE INVENTION

1. Field of the Invention

The present invention relates to technology for amplifying audio signals of a plurality of channels.

2. Description of the Related Art

In order to realize sound effects having a 3-dimensional sensation, audio signals are being used with multi-channels, and the number of speakers used is dramatically increasing. For example, 5.1 channels, which have become mainstream in audio systems in the movie world, have also been applied in recent years to DVD video, digital broadcasting, car audio, and the like. The 5.1 channels are based on 6 channels: front left, front right, rear left, rear right, center, and sub-woofer. In the car audio field, there are cases in which a person in a front seat listens to car navigation audio, while a person in a rear seat listens to audio from a DVD player, and from this type of trend also, the number of speakers is increasing.

With regard to technology related to amplification of audio signals, there has been a proposal with an aim of reducing noise when volume is switched (Patent Document 1). Patent Document 1 discloses technology for reducing shock sound when volume is switched by gradually changing volume control output.

Patent Document 1: Japanese Patent Application, Laid Open No. 2002-26670

Patent Document 2: Japanese Patent Application, Laid Open No. 2005-286532

When considering switching the volume in an acoustic system for multi-channel audio signals, the inventors of this invention recognized the following types of problems.

As an example, when volume data for each channel is transmitted from a microcomputer in accordance with a volume switching instruction from a user, from a constraint of a bus connecting the microcomputer and a volume control side, the volume data of each channel is received at the volume control side with an accompanying time lag. In such cases, a time lag occurs also in switching the volume for each channel, and the user feels something is wrong. This becomes more significant as the number of channels increases.

Countermeasures that may be considered include enlarging bus width of a bus connecting the microcomputer and the volume control side, or, with the same bus widths, using one which has a fast transfer speed. However, enlarging the bus width leads to an increase in the number of pins, and increasing the transfer speed leads to an increase in power consumption. Furthermore, these countermeasures may impede usage of a standard bus. Therefore, it has to be stated that in the present situation getting rid of the time lag in reception of the volume data is unrealistic.

Furthermore, in cases of using technology for countermeasures to switching noise, as disclosed in Patent Document 1, if a configuration for making the change of volume control output gradual is commonly used by a plurality of channels due to constraints of circuit scale, it is no longer possible to change the volume of other channels while the volume control output is being gradually changed for one channel. In such cases, the feeling of the user that something is wrong, due to the time lag, becomes more serious. For example, in 5.1 channel systems, if the volume is being switched in a sequence of center, front right, rear right, rear left, and front left, the user may have a sense that the audio is revolving.

SUMMARY OF THE INVENTION

The present invention has been made in recognition of this situation, and a general purpose thereof is to provide technology for preferably controlling timing of switching of amplification gain of multi-channel audio signals.

An audio signal processing circuit in an embodiment of the present invention is provided with plural variable gain amplifiers that amplify audio signals of a plurality of channels, for each channel, an interface that receives, from outside, plural gain control data individually specifying gain of each channel, a gain controller that switches gain of the plural variable gain amplifiers, based on the plural gain control data, and a timer that measures a predetermined data entry period. The gain controller arranges timing, to change gain of a variable gain amplifier in correspondence with gain control data received in the predetermined data entry period, among the plural gain control data that are inputted at different timing.

There are cases in which it is desired to change the gain of the plural variable gain amplifiers at the same timing. In such cases, in a microprocessor (also referred to as a host processor) that operates an audio signal processing circuit as a slave device, the gain control data may be transmitted to the plural variable gain amplifiers in the same data entry period, and special processing is not necessary.

The timer may start measurement of the data entry period, triggered by initial gain control data being inputted. In such cases, the microprocessor, by sequentially transmitting the gain control data of the variable gain amplifiers for which it is desired to change gain at the same timing, the gain can be changed automatically at the same timing.

The audio signal processing circuit may be further provided with plural registers containing the plural gain control data. The timer may monitor the plural registers, and start measurement of the data entry period, triggered by an occurrence of writing to any of the registers.

The timer may repeatedly measure the predetermined data entry period autonomously.

The timer may give notification to the microprocessor that transmits the plural gain control data, of the start timing of the data entry period. In such cases, by sequentially transmitting the plural gain control data, triggered by the notification being received, the microprocessor can change the gain of the plural channels at the same timing.

The timer may start the data entry period at timing instructed by the microprocessor that transmits the plural gain control data. In such cases, it is possible to control the data entry period on the microprocessor side.

The data entry period may be set in a range at or below 10 ms. If the data entry period is at or below 10 ms, in cases in which, for example, the plural variable gain amplifiers are used in volume control, it is possible to restrain delay from when the user instructs a change of volume until the actual change, to a level that cannot be perceived.

The gain controller may receive the respective plural gain control data via a serial bus. The gain controller may receive the respective plural gain control data via an I²C (Inter-IC Control) bus.

The gain controller may include a soft switching circuit for making the change of the volume gradual, when performing volume switching of respective channels, and the soft switching circuit may be commonly used in order to perform volume switching by variable gain amplifiers of at least two channels.

The data entry period may be set to at least a time-period necessary for receiving all the gain control data for the variable gain amplifiers of at least two channels sharing the common soft switching circuit.

The audio signal processing circuit may be monolithically integrated on one semiconductor substrate. "Monolithically integrated" includes cases in which all component elements of the circuit are formed on the semiconductor substrate, and cases in which main component elements of the circuit are integrated as a unit, and some resistors, capacitors, or the like, for adjusting a circuit constant may be arranged outside the semiconductor substrate.

Another embodiment of the present invention is an audio device. The device is provided with the abovementioned audio signal processing circuit, a microprocessor that transmits the respective plural gain control data to the audio signal processing circuit in response to a user's instruction, and a bus that connects the microprocessor and the audio signal processing circuit.

An even further embodiment of the present invention relates to a volume switching method in which volume of audio signals of plural channels is switched. The method includes generating, by a microprocessor, plural gain control data that individually designate a volume of each channel whose volume is to be switched, based on a volume switching instruction from a user; transmitting, by the microprocessor, the respective plural gain control data to an audio signal processing circuit at different timing; measuring, by the audio signal processing circuit, a predetermined data entry period; and arranging timing to change, by the audio signal processing circuit, gain of a variable gain amplifier that amplifies an audio signal corresponding to gain control data received in the predetermined data entry period, among the plural gain control data inputted at different timing.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, "a state in which a member A is connected to a member B" includes cases in which the member A and the member B are directly and physically connected, and cases in which the member A and the member B are indirectly connected via another member that does not affect an electrical connection state. Similarly, "a state in which a member C is arranged between a member A and a member B" includes, in addition to cases in which the member A and the member C, or the member B and the member C are directly connected, cases in which the members are indirectly connected via another member that does not affect an electrical connection state.

Figure 1:
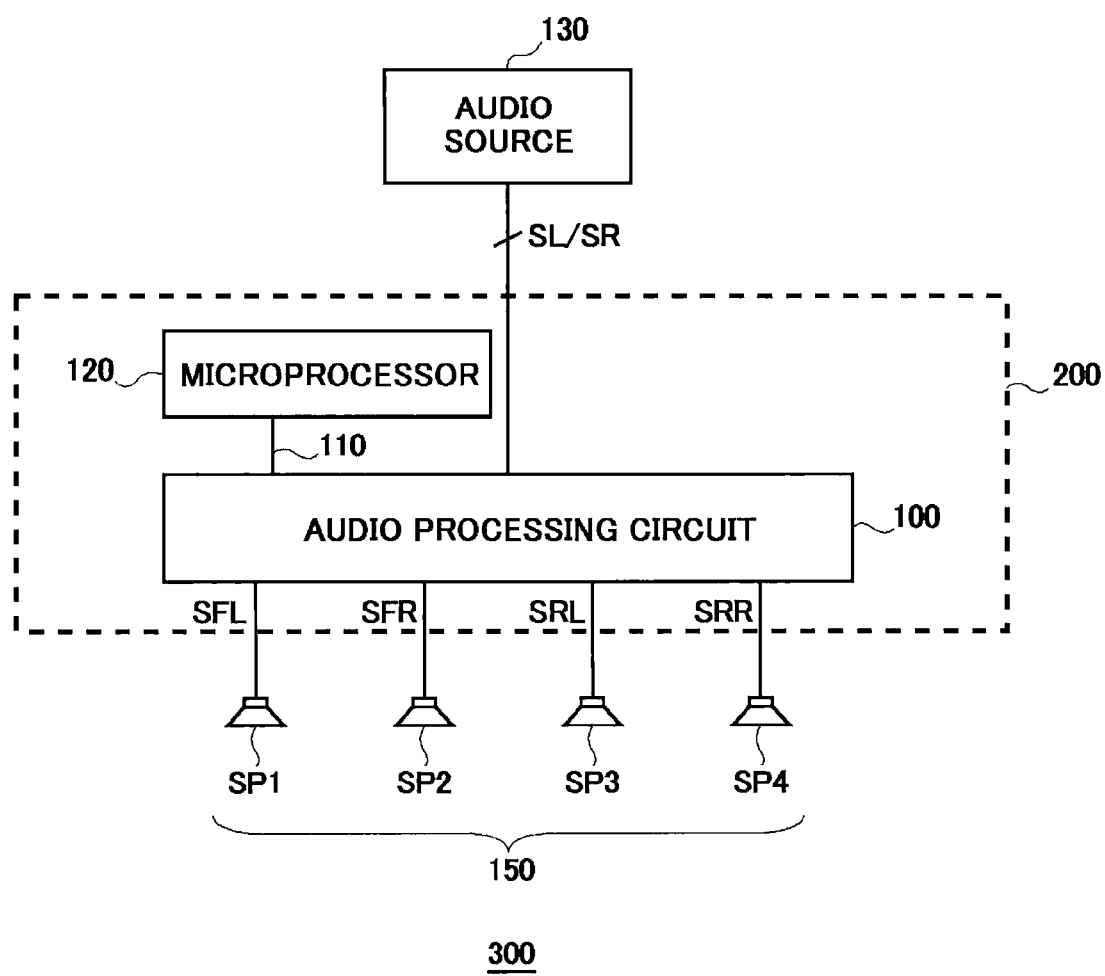
FIG. 1 is a block diagram showing a configuration of an audio system according to an embodiment.

FIG. 1 is a block diagram showing a configuration of an audio system 300 according to an embodiment. The audio system 300 can be applied, for example, to various acoustic systems such as a home theater or a car audio system. Here, there is no particular limitation to specific usages thereof, and as an example a description will be given of the audio system 300 with a total of 4 channels: two front channels (R/L channels) and two rear channels (R/L channels). In the audio system 300, similar audio signals SR are outputted from the front and the rear R channels, and similar audio signals SL are outputted from the front and the rear L channels.

The audio system 300 is provided with a sound source 130, an audio device 200, and a speaker group 150.

The audio device 200 is provided with an audio signal processing circuit 100 and a microprocessor 120. The audio device 200 is, for example, a deck of a home theater or a car audio system.

The audio signal processing circuit 100 and the microprocessor 120 are connected via a bus 110. The bus 110 may be, for example, a serial bus such as an I²C (Inter-IC Control) bus.

The sound source 130 outputs the audio signals SR and SL corresponding to the two left and right channels (R/L) to the audio signal processing circuit 100.

The audio signal processing circuit 100 amplifies the inputted audio signals SR and SL for each channel, and outputs to respective corresponding speakers. The audio signal processing circuit 100, in addition to amplification processing of the audio signals, may perform various processing, such as equalizing processing, tone control, loudness control, and the like. The audio signal processing circuit 100 is integrated as a unit on one semiconductor substrate. By integrating as a unit on one semiconductor substrate, installation in an electrical device such as the audio device 200 or the like is facilitated.

The speaker group 150 includes four speakers SP1 to SP4, corresponding to respective channels: front left (FL), front right (FR), rear left (RL), and rear right (RR). The respective speakers SP1 to SP4 receive audio signals SFL, SFR, SRL, and SRR amplified by the audio signal processing circuit 100, and convert these to acoustic signals.

The audio signal processing circuit 100 is provided with a plurality of variable gain amplifiers (not illustrated in the drawings) for amplifying the audio signals. The several variable gain amplifiers are provided in order to control sound (volume) for each of FL, FR, RL, and RR channels. Furthermore, a necessary number of variable gain amplifiers are provided for equalizing processing, tone control, and loudness control, as required. In order to facilitate understanding below, the description is continued with a focus on only variable gain amplifiers for volume control of each channel.

The microprocessor 120 is provided to control the audio signal processing circuit 100, from outside. The microprocessor 120, for example, receives an instruction to change volume from a user, and controls gain of each variable gain amplifier built-in inside the audio signal processing circuit 100.

The microprocessor 120 transmits plural gain control data that individually specify respective volumes of each of the channels, based on the instruction from the user, to the audio signal processing circuit 100 via the bus 110. Based on the gain control data, the volume of each of the channels of the audio signal processing circuit 100 is determined.

Figures 2, 3:
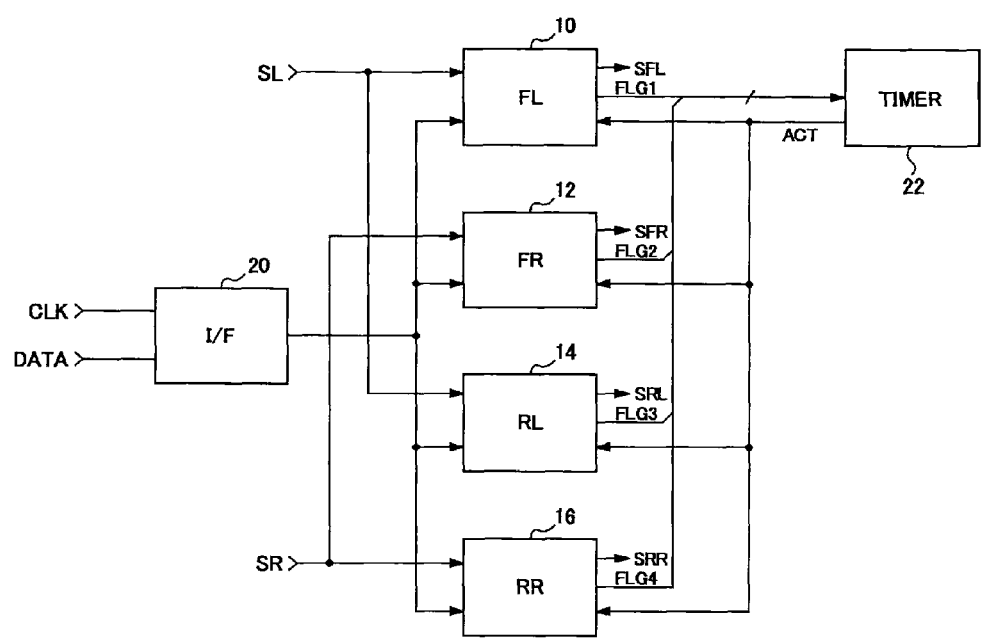
FIG. 2 is a functional block diagram showing a configuration of an audio signal processing circuit according to the embodiment.
FIG. 3 is a diagram showing a format of serial data transmitted via a bus of FIG. 1.

FIG. 2 is a functional block diagram showing a configuration of an audio signal processing circuit 100 according to the embodiment. The audio signal processing circuit 100 is provided with signal processing blocks 10, 12, 14, and 16, an interface 20, and a timer 22.

The audio signals SL of the L channels are inputted to the signal processing blocks 10 and 14. Furthermore, the audio signals SR of the R channels are inputted to the signal processing blocks 12 and 16. The signal processing blocks 10, 12, 14, and 16 execute predetermined signal processing on audio signals of the respective FL, RF, RL, and RR channels. The predetermined signal processing is, for example, amplification with a gain corresponding to a set volume value.

The interface 20 is a 2-wire serial interface, and receives a clock signal CLK and a data signal DATA from the external microprocessor 120. Control data for individually controlling each of the signal processing blocks 10, 12, 14, and 16 are included in the data signal DATA. Specifically, gain control data Dg1 to Dg4 are included for controlling gain of the variable gain amplifiers provided for volume control for each of the respective signal processing blocks 10, 12, 14, and 16.

FIG. 3 shows a format of serial data transmitted via the bus 110 of FIG. 1. The control data transmitted from the microprocessor 120 to the audio signal processing circuit 100 are shown. Here, a format of an I²C bus is described as an example.

The control data include slave address, select address, and volume data. These are each 8 bit data, and the microprocessor 120 generates each of the 8 bits based on an instruction from the user. 1 bit (S: start condition) for indicating a head is inserted at the start of the format. 1 bit (A: Acknowledge bit) is for indicating that each of the 8 bits has been received at the end of the slave address, the select address, and the volume data. 1 bit (P: Stop condition) in the final part of the format is for indicating the end.

The slave address specifies a device that is to be operated. When an instruction for volume adjustment is given, data specifying the audio signal processing circuit 100 is entered here. In cases of a 3-wire serial transmission, a chip select signal may be used instead of the slave address.

The select address is data that specifies a register address to which continuing control data is to be written. The control data is data that is written to an address specified by the select address. In cases of controlling gain of a plurality of variable gain amplifiers, a variable gain amplifier that is to be controlled is specified by the select address, and a gain value is set by the control data.

A description has been given in which all of the slave address, the select address, and the volume data have been included as one set of gain control data, but the select address and the volume data, not including the slave address, may be regarded as one set of gain control data. Or, the volume data, without including the slave address and the select address, may be regarded as one set of gain control data. That is, the gain control data, when they are received, can be understood to be data for being able to know a channel whose gain is to be adjusted and volume that is targeted with respect to that channel. Basically, "being able to know the gain" is not limited to cases of being able to know the gain by receiving stand-alone gain control data, but also includes cases of being able to know this from mutual relationships with data before and after.

The description returns to FIG. 2. In data communication via a serial interface, since it is not possible to transmit plural control data at the same time, transmission is carried out sequentially. That is, the plural control data are inputted at different timing to the audio signal processing circuit 100.

The timer 22 measures a predetermined data entry period τ. When the data entry period τ has elapsed, the timer 22 generates (asserts) an active signal ACT that is at a low level, and outputs to the signal processing blocks 10, 12, 14, and 16. The signal processing blocks 10, 12, 14, and 16 execute processing based on the control data inputted in this data entry period τ, triggered by the active signal ACT reaching a predetermined level (asserted).

In this way, the audio signal processing circuit 100 arranges timing to execute signal processing instructed by the control data received in the data entry period τ, among plural control data that are inputted at different timing.

The timer 22 starts measurement of the data entry period τ, triggered by the control data being inputted to any of the signal processing blocks 10, 12, 14, and 16. In other words, measurement of the data entry period is started at timing at which the initial control data are inputted.

Figure 4:
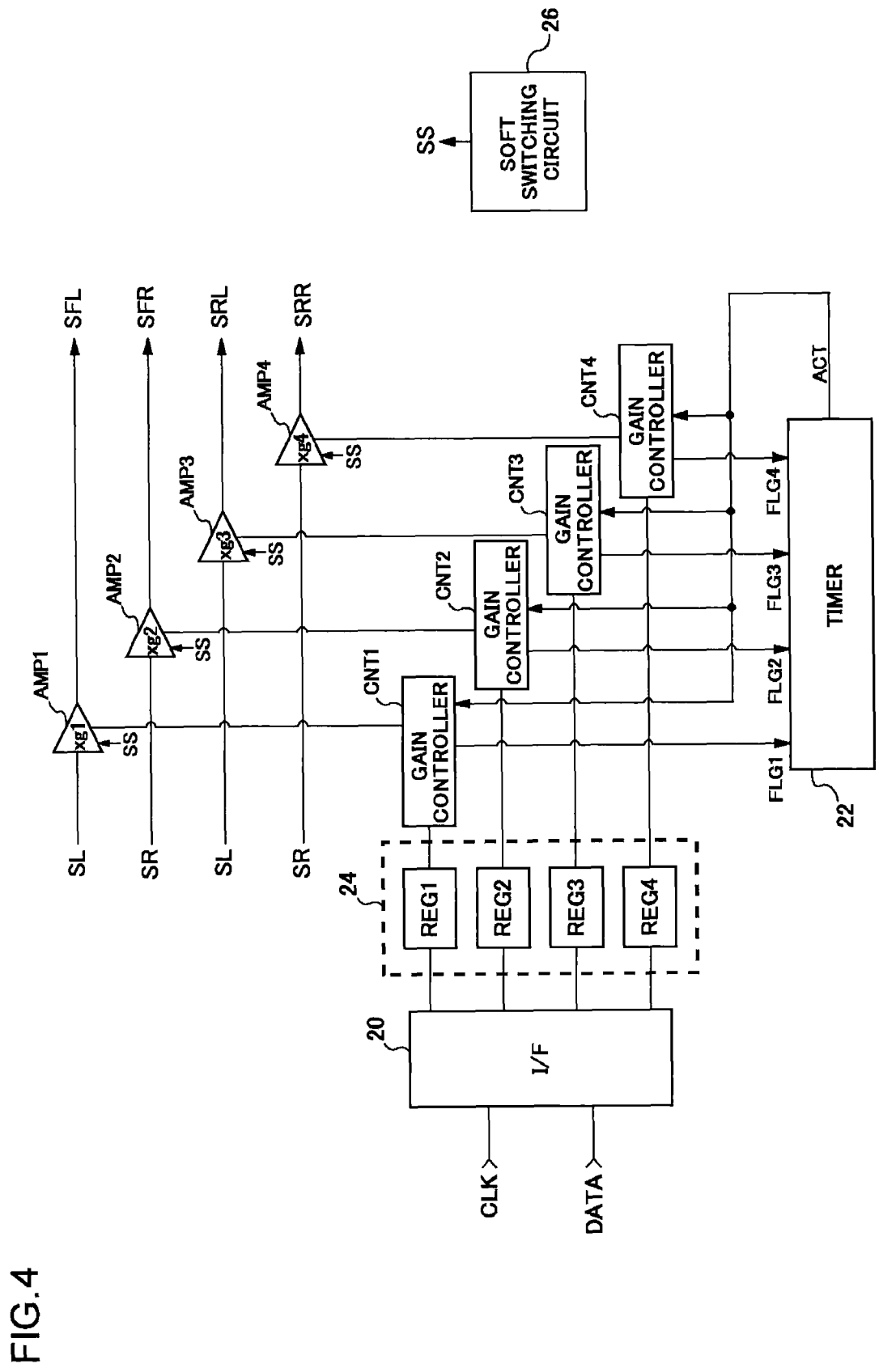
FIG. 4 is a block diagram showing a configuration example of the audio signal processing circuit.

FIG. 4 is a block diagram showing a configuration example of the audio signal processing circuit 100. The audio signal processing circuit 100 is provided with variable gain amplifiers AMP1 to AMP4, gain controllers CNT1 to CNT4, an interface 20, a timer 22, and a register 24.

The variable gain amplifiers AMP1 to AMP4 respectively amplify audio signals for each channel. The gain controllers CNT1 to CNT4 control gain of the corresponding variable gain amplifiers AMP1 to AMP4.

The control data inputted to the interface 20 are written to registers (REG1 to REG4) specified by address data of the register 24. Gain control data setting gains of the variable gain amplifiers AMP1 to AMP4 are respectively written to the registers REG1 to REG4.

The gain controllers CNT1 to CNT4 switch gains g1 to g4 of the corresponding variable gain amplifiers AMP1 to AMP4, based on the gain control data written to the corresponding registers REG1 to REG4.

The gain controllers CNT1 to CNT4 each include a register monitor which monitors writing of data to the corresponding registers REG1 to REG4. When the gain control data are written to the corresponding registers REG1 to REG4, each of the register monitors of the gain controllers CNT1 to CNT4 make an assertion by transitioning flags FLG1 to FLG4 to a predetermined level (high level). The flags FLG1 to FLG4 are inputted to the timer 22.

When any of the flags FLG are asserted, the timer 22 starts measurement of a predetermined data entry period τ. When the data entry period τ elapsed, the active signal ACT is transitioned to a predetermined level to make an assertion, and an instruction to start gain control processing is given to the gain controllers CNT1 to CNT4.

When the active signal ACT goes to a high level, if a corresponding flag FLGi is asserted, an i-th gain controller CNTi changes gain gi of a variable gain amplifier AMPi to a target value in accordance with gain control data written to a register REGi. When gain control of each channel is completed, the registers REG1 to REG4 are negated.

If gain of an amplifier that amplifies an audio signal is suddenly changed, the amplitude of the audio signal becomes discontinuous and noise is generated. In order to solve this problem, technology (referred to as soft switching) is used, which gradually changes the gain of the variable gain amplifier from the present value towards a target value, and for this purpose, a soft switching circuit 26 is provided.

The soft switching circuit 26 is a circuit for making the change of the volume gradual, when performing volume switching of respective channels. As technology for gradually changing the volume, well-known technology as described in the abovementioned Patent Documents 1 and 2, for example, can be used. The soft switching circuit 26 is commonly used for switching the volume of all the channels. In FIG. 4, a signal outputted by the soft switching circuit 26 for making the change in gain gradual is described as "SS".

With regard to the gain controllers CNT1 to CNT4, even on receiving gain control data Dg1 to Dg4, each gain control data does not immediately switch the gain of the variable gain amplifier of a channel whose volume is to be switched, but waits until the active signal ACT is asserted, and switches the gain with an assertion as a trigger.

Figure 5:
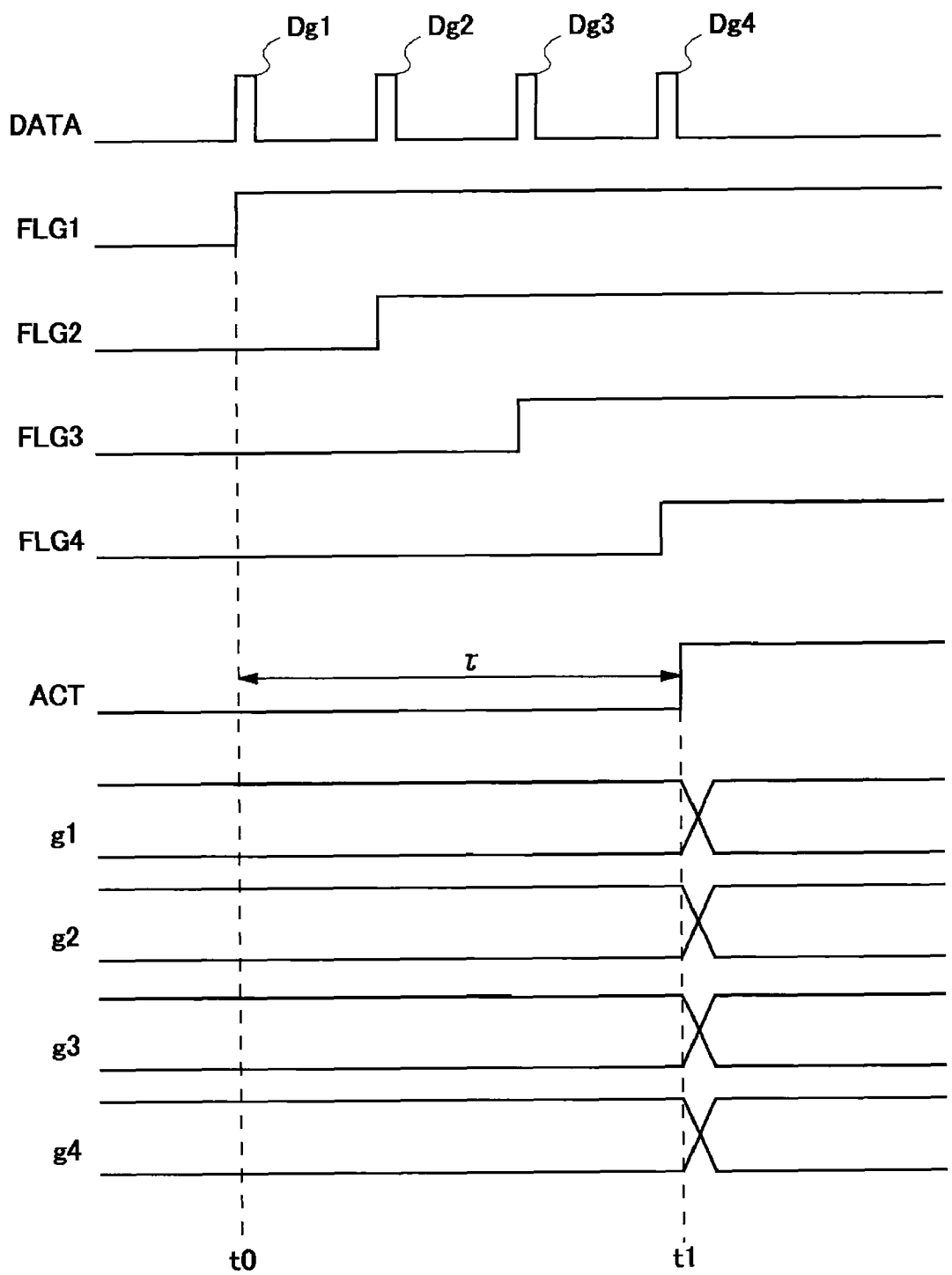
FIG. 5 is a time chart showing operation of the audio signal processing circuit of FIG. 4.

The above description is of a configuration of the audio signal processing circuit 100. Next, operation thereof is described. FIG. 5 is a time chart showing operation of the audio signal processing circuit 100 of FIG. 4. The gain control data Dg1 to Dg4 are sequentially outputted from the microprocessor 120 via the bus 110. The microprocessor 120 may use an address auto-increment function to sequentially output the gain control data Dg1 to Dg4, or may output only the gain control data of a channel for which gain has to be changed.

At time t0, the initial gain control data Dg1 is written to an address REG1 of the register 24. When this is received, the flag FLG1 is asserted, and the timer 22 starts a count for the data entry period τ. Thereafter, the gain control data Dg2 to Dg4 are sequentially written to the registers 24.

At time t1 after the data entry period τ has elapsed, the active signal ACT is asserted. When the active signal ACT is asserted, the gain controllers CNT1 to CNT4 perform soft switching of the gains g1 to g4 to target values, at the same timing.

The above description is of operation of the audio signal processing circuit 100. According to the embodiment, since the audio signal processing circuit 100 arranges timing to switch the gain of the variable gain amplifiers AMP1 to AMP4 of each channel, timing of volume switching of speech outputted from respective channel speakers is arranged. In this way it is possible to reduce a feeling of the user that something is wrong when volume switching is performed, and this leads to raising the value of the audio device 200.

Since the timer 22 starts measurement of the data entry period τ, triggered by the initial gain control data being inputted, it is possible to automatically change the gain at the same timing, by the microprocessor 120 sequentially transmitting the gain control data of a variable gain amplifier whose gain it is desired to change at the same timing.

Furthermore, in the present embodiment, since the data entry period τ is managed on the audio signal processing circuit 100 side, and this is used to arrange timing of switching respective channel volumes, there is an advantage in that particular processing is not required on the microprocessor 120 side. It is enough if the microprocessor 120 outputs, within the same data entry period τ, the gain control data of the channel whose gain is to be changed at the same timing.

In other words, it is desirable that the data entry period τ be set to a time-period of at least that required for receiving all the gain control data with respect to the plural variable gain amplifiers that share the common soft switching circuit 26. From this viewpoint, the data entry period τ is dependent upon the number of amplifiers to be controlled and the transmission speed of the bus 110, and is preferably set to 10 ms or less and typically within a range of 0.1 ms to 10 ms.

In the embodiment, since the gain change of the variable gain amplifiers, when volume switching is performed by the soft switching circuit 26, is gradual, shock sound when switching is prevented. Furthermore, since the soft switching circuit 26 is commonly used by the variable gain amplifiers of the respective channels, enlargement of circuit size is restrained. Here, when the soft switching circuit 26 is commonly used, when the gain of the variable gain amplifier is switched every time the gain control data is received, the feeling that something is wrong when the volume is switched becomes serious, but in the present embodiment as described above, since the timing of switching the gain of the variable gain amplifier is arranged, this type of problem is preferably solved.

Figure 6:
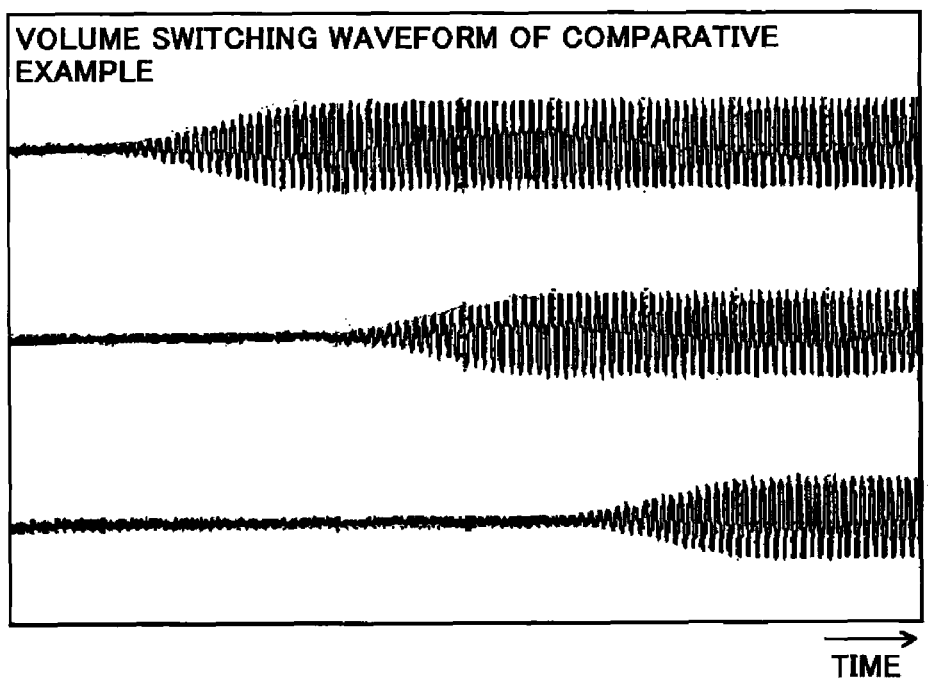
FIG. 6 is a diagram showing a volume switching waveform in a comparative example.
Figure 7:
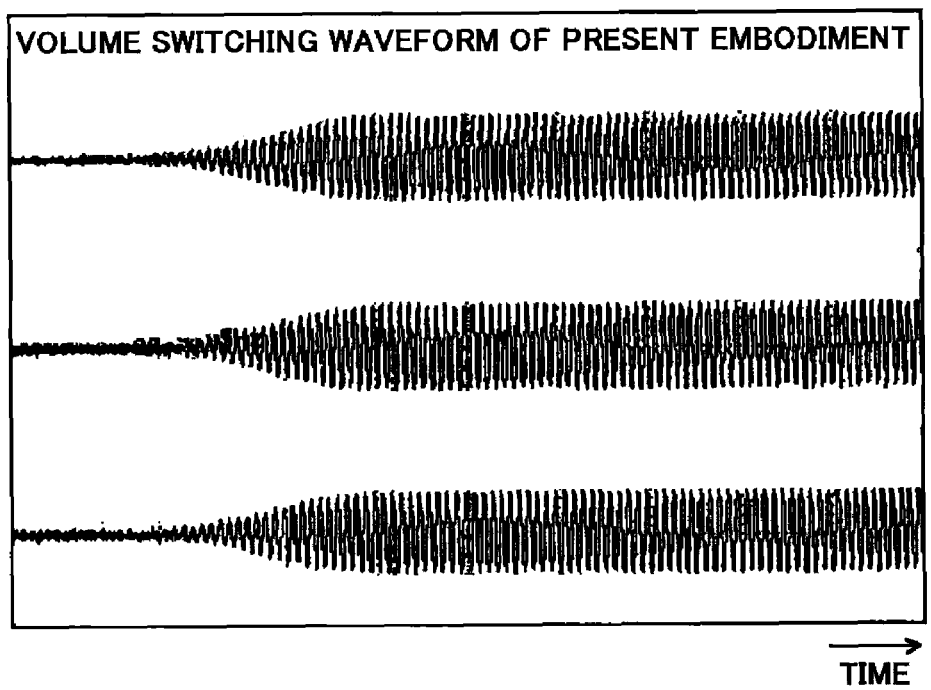
FIG. 7 is a diagram showing a volume switching waveform in the present embodiment.

In order to clearly understand an effect of the present embodiment, volume switching waveforms of FIG. 6 and FIG. 7 are compared. FIG. 6 shows a volume switching waveform in a comparative example. FIG. 7 shows a volume switching waveform of the present embodiment.

With regard to a configuration in which the soft switching circuit 26 is commonly used, the comparative example is an example in which the gain of a variable gain amplifier is switched every time the gain control data are received. In the comparative example, the soft switching circuit 26 is operated the same number of times as the number of channels, and while the volume of one channel is being gradually changed, switching of other channels must wait. That is, after waiting for soft switching of the volume of the first channel to finish, the volume of a subsequent channel is gradually switched, and furthermore a subsequent channel during this time is still in a switch waiting state. Therefore, the switching waveform, in which there is a time lag for each channel, is as in FIG. 6, and the user feels there is something wrong each time volume switching is done.

In contrast to this, in the present embodiment as described above, by arranging timing, to switch the gain of the variable gain amplifiers of each channel, it is sufficient for an operation of the soft switching circuit 26 to be performed once for one volume switching. Thus, as shown in FIG. 7, a simultaneous switching waveform different from the comparative example is obtained. Therefore, the feeling by the user that something is wrong when volume switching is performed is reduced, and natural volume switching can be realized.

The abovementioned embodiment is an example; various modifications of combinations of various component elements and various processes thereof are possible, and a person skilled in the art may understand that such modified examples are within the scope of the present invention. Below, a modified example is illustrated.

MODIFIED EXAMPLE 1

The timer 22 may repeatedly measure a predetermined data entry period τ autonomously without regard to writing of the gain control data. In such cases also, an effect similar to the abovementioned embodiment is obtained. In addition, the timer 22 may notify start timing of the data entry period τ, to a microprocessor 120 that transmits plural gain control data. In such cases, by sequentially transmitting the plural gain control data, triggered by the notification being received, the microprocessor 120 can change the gain of the plural channels at the same timing.

MODIFIED EXAMPLE 2

The timer 22 may start a data entry period τ at timing instructed by a microprocessor 120 that transmits plural gain control data. In such cases an effect similar to the embodiment is obtained, and it is possible to control the data entry period τ on the microprocessor 120 side.

ANOTHER MODIFIED EXAMPLE

In the embodiment the bus connecting the microprocessor 120 and the audio signal processing circuit 100 was a serial bus, but there is no limitation thereto, and a parallel bus may also be used.

In the embodiment, the gain controllers CNT1 and CNT4 arrange timing to switch the gain of the variable gain amplifiers of each channel. In the modified example, in addition to this, the gain controllers CNT1 to CNT4 have configurations in which a mode of switching the gain of the variable gain amplifiers is also executable every time gain control data are received. A decision as to which operation is to be executed may be made as appropriate according to a setting beforehand. According to this, freedom is obtained for user selection.

In the embodiment, the soft switching circuit 26 was commonly used by all the channels, but there is no limitation thereto, and the soft switching circuit 26 need not be commonly used by some of the channels. Furthermore, if there is no necessity for a gradually change of the gain of the variable gain amplifiers in some of the channels, there is no need for the variable gain amplifiers of these channels to use the soft switching circuit 26. In this way, circuit design degree of freedom is increased.

In the embodiment the audio system 300 was described as a 4-channel system, but there is no limitation to this. The number of audio signal channels is arbitrary as long as it is plural. Furthermore, the variable gain amplifiers are not limited to volume control, and may be used for tone control and equalizing.

Furthermore, in the embodiment, cases were described in which the gain of a variable gain amplifier is controlled, but the present invention is not limited thereto, and expansion is possible to plural processors that perform arbitrary signal processing, instead of amplifiers. That is, the audio signal processing circuit 100 according to an embodiment of the present invention is provided with plural signal processors that execute predetermined signal processing, an interface that receives, from outside, control data individually controlling each signal processor, and a timer that measures a predetermined data entry period. The audio signal processing circuit 100 arranges timing to execute signal processing instructed by the control data received in the predetermined data entry period, among plural control data that are inputted at different timing.

While the preferred embodiments of the present invention have been described using specific terms, such description is for illustrative purposes only, and it is to be understood that changes and variations may be made without departing from the spirit or scope of the appended claims.

What is claimed is:

1. An audio signal processing circuit comprising:
a plurality of variable gain amplifiers provided for respective ones of a plurality of channels, each of which amplifies an analog audio signal of the respective channel;
an interface that receives, from outside, plural gain control data at different timing, plural gain control data specifying respective gain of the plurality of variable gain amplifiers;
a plurality of gain controllers provided for respective ones of the plurality of variable gain amplifier, each of which switches gain of a corresponding one of the plurality of variable gain amplifiers, based on the corresponding one of the plural gain control data; and
a timer that measures a predetermined data entry period and generates an active signal having a predetermined level when the data entry period has elapsed; wherein
each gain controller receives the active signal and the corresponding one of the plural gain control data, and wherein
when the active signal is generated, each gain controller changes the gain of the corresponding one of the plurality of variable gain amplifiers based on the corresponding one of the plural gain control data that has been received in the previous data entry period.

2. The audio signal processing circuit according to claim 1, wherein the timer starts measurement of the data entry period, triggered by initial data of the gain control data being inputted.

3. The audio signal processing circuit according to claim 2, further comprising
plural registers containing the plural gain control data; wherein
the timer monitors the plural registers, and starts measurement of the data entry period, triggered by an occurrence of writing to any of the registers.

4. The audio signal processing circuit according to claim 1, wherein the timer repeatedly measures the predetermined data entry period autonomously.

5. The audio signal processing circuit according to claim 1, wherein the timer notifies start timing of the data entry period, to a microprocessor that transmits the plural gain control data.

6. The audio signal processing circuit according to claim 1, wherein the timer starts the data entry period at timing instructed by a microprocessor that transmits the plural gain control data.

7. The audio signal processing circuit according to claim 1, wherein the data entry period is set to 10 ms or less.

8. The audio signal processing circuit according to claim 1, wherein each of the plurality of gain controllers receives the respective plural gain control data via a serial bus.

9. The audio signal processing circuit according to claim 1, wherein each of the plurality of gain controllers receives the respective plural gain control data via an I²C (Inter-IC Control) bus.

10. The audio signal processing circuit according to claim 1, wherein each of the plurality of gain controllers comprises:
a soft switching circuit for making change of volume gradual, when performing volume switching of respective channels; and
the soft switching circuit is commonly used in order to perform volume switching by variable gain amplifiers of at least two channels.

11. The audio signal processing circuit according to claim 10, wherein the data entry period is set to at least a time-period necessary for receiving all the gain control data for the variable gain amplifiers of the at least two channels sharing the common soft switching circuit.

12. The audio signal processing circuit according to claim 1, integrated as a unit on one semiconductor substrate.

13. An audio signal processing circuit comprising:
plural signal processors that execute predetermined signal processing;
an interface that receives, from outside, control data individually controlling each signal processor; and
a timer that measures a predetermined data entry period; wherein timing is arranged to execute signal processing instructed by control data received in the predetermined data entry period, among plural control data inputted at different timing.

14. An audio device comprising the audio signal processing circuit according to claim 1;

a microprocessor that transmits the respective plural gain control data to the audio signal processing circuit in response to a user's instruction; and a bus that connects the microprocessor and the audio signal processing circuit.

15. A volume switching method in which volume of analog audio signals of plural channels is switched, the method comprising:

generating, by a microprocessor, plural gain control data that individually designate a volume of each channel whose volume is to be switched, based on a volume switching instruction from a user;

transmitting, by the microprocessor, the respective plural gain control data to an audio signal processing circuit at different timing;

measuring, by the audio signal processing circuit, a predetermined data entry period; and generating an active signal having a predetermined level when the data entry period has elapsed; wherein when the active signal is generated, in each channel, gain of corresponding one of a plurality of variable gain amplifiers that amplify respective analog audio signals of the plural channels based on respective one of the plural gain control data that has been received in the previous data entry period.

16. An audio signal processing circuit comprising:

plural variable gain amplifiers that amplify audio signals of a plurality of channels, for each channel;

an interface that receives, from outside, plural gain control data individually specifying gain of each channel;

a gain controller that switches gain of the plural variable gain amplifiers, based on the plural gain control data; and a timer that measures a predetermined data entry period; wherein the gain controller arranges timing to change gain of a variable gain amplifier corresponding to gain control data received in the predetermined data entry period, among the plural gain control data that are inputted at different timing, and wherein the gain controller comprises:

a soft switching circuit for making change of volume gradual, when performing volume switching of respective channels; and the soft switching circuit is commonly used in order to perform volume switching by variable gain amplifiers of at least two channels.

17. The audio signal processing circuit according to claim 16, wherein the data entry period is set to at least a time-period necessary for receiving all the gain control data for the variable gain amplifiers of the at least two channels sharing the common soft switching circuit.

* * * * *